US012684935B2

(12) United States Patent
Kimoto

(10) Patent No.: US 12,684,935 B2
(45) Date of Patent: Jul. 14, 2026

(54) LIGHT-EMITTING ELEMENT, LIGHT-EMITTING DEVICE, LIGHT-EMITTING DEVICE PRODUCTION METHOD, AND ELECTRONIC DEVICE

(71) Applicant: SHARP KABUSHIKI KAISHA, Sakai City (JP)

(72) Inventor: Kenji Kimoto, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 371 days.

(21) Appl. No.: 18/278,522

(22) PCT Filed: Mar. 3, 2021

(86) PCT No.: PCT/JP2021/008150
§ 371 (c)(1),
(2) Date: Aug. 23, 2023

(87) PCT Pub. No.: WO2022/185445
PCT Pub. Date: Sep. 9, 2022

(65) Prior Publication Data
US 2024/0138172 A1 Apr. 25, 2024
US 2024/0237381 A9 Jul. 11, 2024

(51) Int. Cl.
*H10K 50/115* (2023.01)
*H01L 33/06* (2010.01)
*H10H 20/812* (2025.01)

(52) U.S. Cl.
CPC ......... *H10K 50/115* (2023.02); *H10H 20/812* (2025.01)

(58) Field of Classification Search
CPC ...... H10K 50/115; H10K 50/11; H10K 50/38; H10K 50/156; H10K 2102/331; H10H 20/812; H10H 20/12; H10H 20/01; H10H 20/8515; H05B 33/10; H05B 33/14; H05B 33/12; H05B 33/02
See application file for complete search history.

(56) References Cited

U.S. PATENT DOCUMENTS

| | | | |
|---|---|---|---|
| 10,651,339 B2 | 5/2020 | Kim | |
| 12,349,533 B2 * | 7/2025 | Kim | H10K 50/171 |
| 2017/0186988 A1 | 6/2017 | Kim | |
| 2017/0271552 A1 | 9/2017 | Kim | |
| 2022/0149310 A1 * | 5/2022 | Kim | H10K 50/155 |

* cited by examiner

*Primary Examiner* — Nikolay K Yushin
(74) *Attorney, Agent, or Firm* — ScienBiziP, P.C.

(57) ABSTRACT

A light-emitting element includes a light-emitting layer provided between a first electrode and a second electrode and including quantum dots, and an interposition film interposed between the first electrode and the light-emitting layer, and the interposition film includes a halogen simple substance including first halogen atoms.

18 Claims, 6 Drawing Sheets

LIGHT-EMITTING ELEMENT, LIGHT-EMITTING DEVICE, LIGHT-EMITTING DEVICE PRODUCTION METHOD, AND ELECTRONIC DEVICE

TECHNICAL FIELD

The disclosure relates to a light-emitting element including a first electrode, a second electrode, and a light-emitting layer provided between the first electrode and the second electrode and including quantum dots, a light-emitting device, a light-emitting device manufacturing method, and an electronic device.

BACKGROUND ART

There is known a light-emitting element including a first electrode, a second electrode, a light-emitting layer provided between the first electrode and the second electrode and including quantum dots, and a hole transport layer provided between the first electrode and the light-emitting layer (PTL 1). The hole transport layer of the light-emitting element contains copper iodide (p-CuI).

CITATION LIST

Patent Literature

PTL 1: U.S. Pat. No. 10,651,339

SUMMARY

Technical Problem

A light-emitting layer containing quantum dots has a problem of low luminous efficiency because non-radiative recombination of electron-hole pairs on the surfaces of the quantum dots tends to occur.

An aspect of the disclosure is to implement a light-emitting element, a light-emitting device, a light-emitting device manufacturing method, and an electronic device that are capable of improving luminous efficiency of a light-emitting layer containing quantum dots.

Solution to Problem

In order to solve the above-described problem, a light-emitting element according to an aspect of the disclosure includes a first electrode, a second electrode, a light-emitting layer provided between the first electrode and the second electrode and including quantum dots, and an interposition film interposed between the first electrode and the light-emitting layer, in which the interposition film includes a halogen simple substance including first halogen atoms.

In order to solve the above-described problem, another light-emitting element according to an aspect of the disclosure includes a first electrode, a second electrode, a light-emitting layer provided between the first electrode and the second electrode and including quantum dots, and an interposition film interposed between the first electrode and the light-emitting layer, in which the interposition film includes first metal atoms and first halogen atoms, and the light-emitting layer further includes second halogen atoms of the same element as the first halogen atoms.

In order to solve the above-described problem, a light-emitting device according to an aspect of the disclosure includes the light-emitting element according to the aspect of the disclosure and a substrate, in which the second electrode is disposed between the substrate and the light-emitting layer.

In order to solve the above-described problem, a light-emitting device manufacturing method according to an aspect of the disclosure is a light-emitting device manufacturing method of manufacturing the light-emitting device according to the aspect of the disclosure, and includes forming a light-emitting layer including quantum dots, forming an interposition film on the light-emitting layer formed in the forming of the light-emitting layer, and performing heat treatment at 100° C. or more and 400° C. or less after the forming of the interposition film.

In order to solve the above-described problem, an electronic device according to an aspect of the disclosure includes the light-emitting element according to the aspect of the disclosure.

Advantageous Effects of Disclosure

According to an aspect of the disclosure, it is possible to improve luminous efficiency of a light-emitting layer containing quantum dots.

DESCRIPTION OF EMBODIMENTS

First Embodiment

Figure 1:
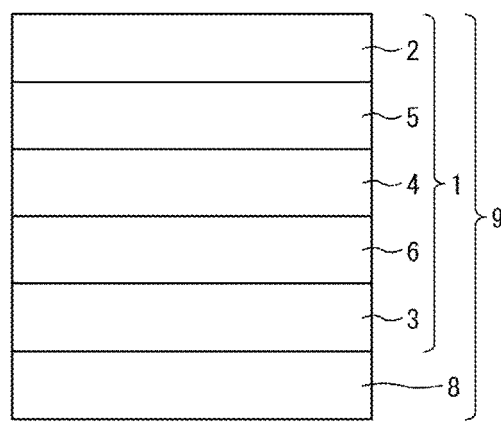
FIG. 1 is a cross-sectional view of a light-emitting element according to a first embodiment.

FIG. 1 is a cross-sectional view of a light-emitting element 1 according to a first embodiment.

The light-emitting element 1 includes a first electrode 2, a second electrode 3, a light-emitting layer 4 provided between the first electrode 2 and the second electrode 3 and including quantum dots, an interposition film 5 interposed between the first electrode 2 and the light-emitting layer 4, and an electron transport layer (ETL) 6 formed between the second electrode 3 and the light-emitting layer 4.

The first electrode 2 is an anode electrode and may be formed using Al, Ag, ITO, ZnO, IZO, or the like.

A quantum dot is a particle having a maximum width of 100 nm or less. The shape of the quantum dot is not particularly limited as long as it is within a range satisfying the maximum width, and the shape is not limited to a spherical three-dimensional shape (circular cross-sectional shape). The shape of the quantum dot may be, for example, a polygonal cross-sectional shape, a rod-shaped three-dimensional shape, a branch-shaped three-dimensional shape, or a three-dimensional shape having unevenness on the surface thereof, or a combination thereof.

The interposition film 5 includes a halogen simple substance containing first halogen atoms. The first halogen atoms are, for example, iodine atoms, and the halogen simple substance is, for example, solid iodine.

In this case, it is possible to inactivate the surface of the quantum dot and suppress non-radiative combination of electron-hole pairs by diffusing the first halogen atoms into the light-emitting layer 4. As a result, luminous efficiency of the light-emitting element 1 is improved.

It is preferable that the light-emitting layer 4 further contain second halogen atoms of the same element as the first halogen atoms.

Thereby, the second halogen atoms contained in the light-emitting layer 4 are coordinated with the surfaces of the quantum dots of the light-emitting layer 4 to inactivate the surfaces of the quantum dots, thereby suppressing non-radiative combination of electron-hole pairs. As a result, luminous efficiency of the light-emitting element 1 is improved.

It is preferable that the second halogen atoms contained in the light-emitting layer 4 be derived from the first halogen atoms contained in the interposition film 5. Thereby, the second halogen atoms derived from the first halogen atoms contained in the interposition film 5 and diffused into the light-emitting layer 4 are coordinated with the surfaces of the quantum dots to inactivate the surfaces of the quantum dots, thereby suppressing non-radiative combination of electron-hole pairs.

An atomic number density of the first halogen atoms contained in the interposition film 5 is preferably 75 at % or more. This makes it easier for the first halogen atoms of the interposition film 5 to enter and diffuse into the light-emitting layer 4. An atomic number density of the first halogen atoms contained in the interposition film 5 is more preferably 90 at % or more, and still more preferably 95 at % or more. This makes it easier for the first halogen atoms of the interposition film 5 to enter the light-emitting layer 4, thereby further suppressing non-radiative combination of electron-hole pairs in the light-emitting layer 4.

In the present specification, an atomic number density is measured by Auger electron spectroscopy on a cross-section exposed by cutting the light-emitting element along a layer thickness direction of the light-emitting layer. As a relative sensitivity coefficient of each element, a value recommended by an apparatus manufacturer of an apparatus to be used is used. When it is found as a result of the measurement that the atomic number density satisfies limiting conditions (including a numerical limiting range, a magnitude relationship, and the manner of distribution of the atomic number density) in a portion (measurement portion) of a certain cross-section, at least one of the effects of the disclosure is exhibited in at least the portion of the cross-section, and thus it can be said that the light-emitting element exhibits the effects of the disclosure.

In the present specification, an "atomic number density of 0" of a certain atom means that the atomic number density of the certain atom is equal to or less than a measurement limit value, equal to or less than a noise level, or is actually 0.

Figure 2:
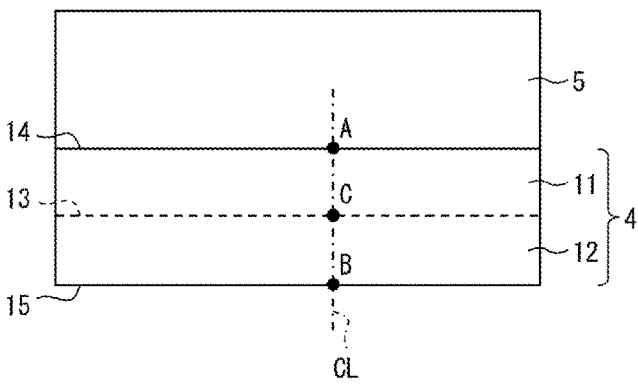
FIG. 2 is a cross-sectional view illustrating a first region and a second region of a light-emitting layer provided in the light-emitting element.

FIG. 2 is a cross-sectional view illustrating a first region 11 and a second region 12 of the light-emitting layer 4 provided in the light-emitting element 1.

The light-emitting layer 4 includes the first region 11 from a center 13 of the light-emitting layer 4 to an end 14 on the first electrode 2 side in the layer thickness direction, and the second region 12 from the center 13 of the light-emitting layer 4 to an end 15 on the second electrode 3 side in the layer thickness direction. It is preferable that an average value of the atomic number density of the second halogen atoms in the first region 11 be larger than an average value of the atomic number density of the second halogen atoms in the second region 12. Since the carrier mobility of holes in the light-emitting layer 4 is smaller than that of electrons, electroluminescence (EL) light emission in the light-emitting layer 4 is more likely to occur in the first region than in the second region. Thus, since the average value of the atomic number density of the second halogen atoms in the first region is larger than the average value of the atomic number density of the second halogen atoms in the second region, it is possible to effectively suppress non-radiative recombination of electron-hole pairs and improve luminous efficiency. The average value of the atomic number density of the second halogen atoms in the first region 11 is a value obtained by integrating the atomic number density of the second halogen atoms along the layer thickness direction of the light-emitting layer 4 in the first region 11 and dividing the integrated value by the layer thickness of the first region 11 (a distance from the center 13 of the light-emitting layer 4 to the end 14 on the first electrode 2 side in the layer thickness direction). The average value of the atomic number density of the second halogen atoms in the second region 12 is a value obtained by integrating the atomic number density of the second halogen atoms along the layer thickness direction of the light-emitting layer 4 in the second region 12 and dividing the integrated value by the layer thickness of the second region 12 (a distance from the center 13 of the light-emitting layer 4 to the end 15 on the second electrode 3 side in the layer thickness direction).

When the surface of the light-emitting layer 4 is exposed to the atmosphere in a manufacturing process of the light-emitting element 1, a ligand coordinated with the quantum dots is likely to be dissociated in the first region 11, and non-radiative recombination of electron-hole pairs is likely to occur. Thus, since the average value of the atomic number density of the second halogen atoms in the first region 11 is larger than the average value of the atomic number density of the second halogen atoms in the second region 12, it is possible to effectively suppress non-radiative recombination of electron-hole pairs and improve luminous efficiency.

Figure 3:
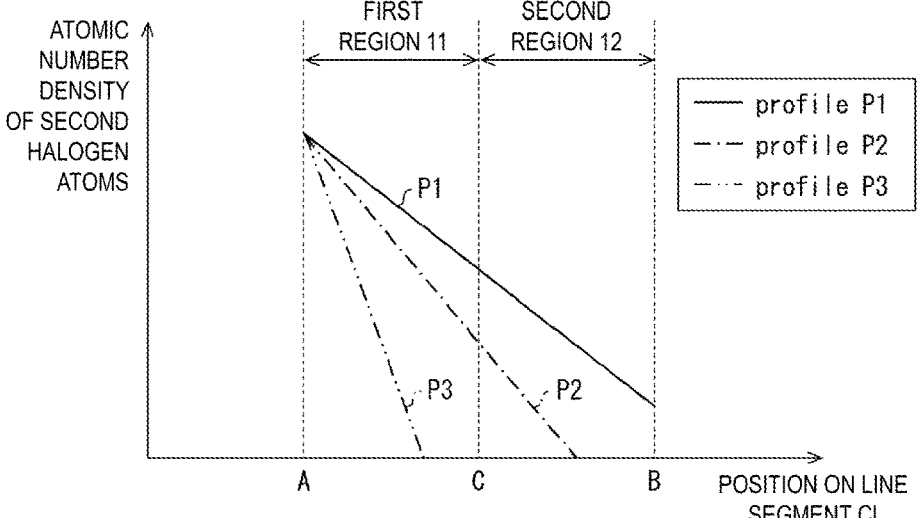
FIG. 3 is a schematic graph showing a profile of an atomic number density of second halogen atoms in the light-emitting layer.

FIG. 3 is a schematic graph showing a schematic profile of an atomic number density of the second halogen atoms in the light-emitting layer 4. A horizontal axis represents the position of the light-emitting layer 4 on a line segment CL illustrated in FIG. 2, and a vertical axis represents an atomic number density of the second halogen atoms. Profiles P1, P2, and P3 indicate atomic number densities of the second halogen atoms of the light-emitting layer 4 on the line segment CL. In the profile P1, the atomic number density of the second halogen atoms decreases linearly from a position A corresponding to the end 14 of the light-emitting layer 4 to a position B corresponding to the end 15 via a position C corresponding to the center 13. In the profile P2, the atomic number density of the second halogen atoms decreases linearly from the position A and becomes zero between the position C and the position B. In the profile P3, the atomic number density of the second halogen atoms decreases linearly from the position A and becomes zero between the position A and the position C.

In all of the profiles P1, P2, and P3, an average value of the atomic number density of the second halogen atoms in the first region 11 is larger than an average value of the atomic number density of the second halogen atoms in the second region 12.

In all of the profiles P1, P2, and P3, the atomic number density of the second halogen atoms decreases gradually from a position at which the atomic number density of the second halogen atoms is maximum toward the second electrode 3 side in the layer thickness direction of the light-emitting layer 4.

In all of the profiles P1, P2, and P3, the position at which the atomic number density of the second halogen atoms is maximum is the position A equivalent to the end 14 of the light-emitting layer 4 on the first electrode 2 side.

Although the profiles P1, P2, and P3 show an example in which the atomic number density of the second halogen atoms decreases linearly, the disclosure is not limited thereto. As long as the atomic number density decreases monotonically or decreases gradually from the position A toward the position B, it may decrease in a curved shape.

Figure 4:
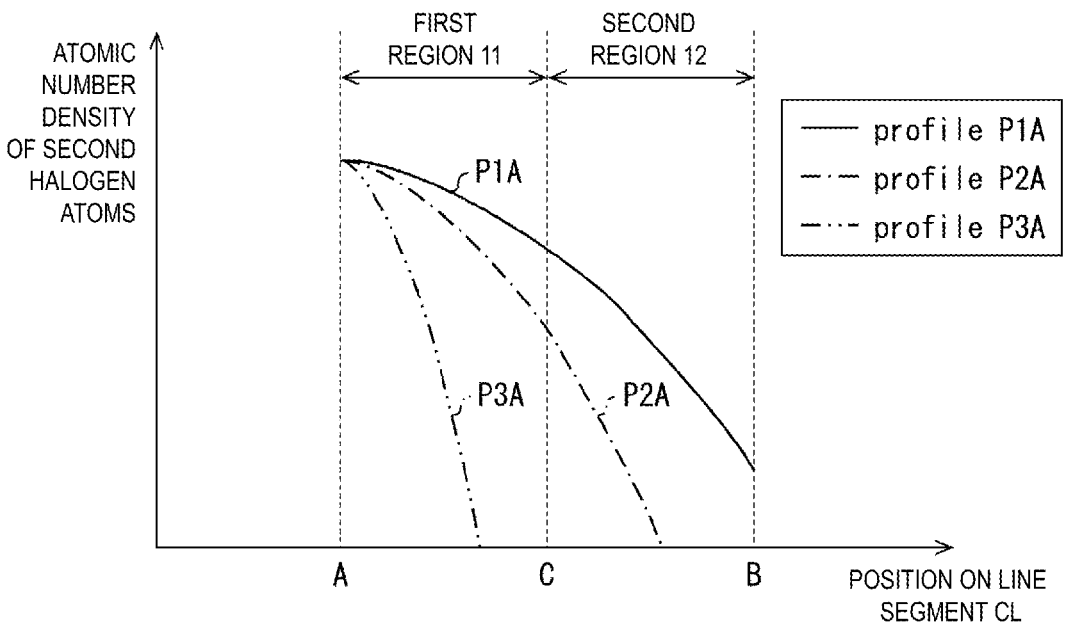
FIG. 4 is a schematic graph showing another profile of the atomic number density of the second halogen atoms.

FIG. 4 is a schematic graph showing another schematic profile of the atomic number density of the second halogen atoms. The same components as the above-described components are denoted by the same reference numerals, and detailed description of the components is not repeated.

In a profile P1A, an atomic number density of the second halogen atoms decreases gradually in an upwardly convex curved shape from the position A to the position B via the position C. In a profile P2A, an atomic number density of the second halogen atoms decreases gradually from the position A in an upwardly convex curved shape and becomes zero between the position C and the position B. In a profile P3A, an atomic number density of the second halogen atoms decreases gradually from the position A in an upwardly convex curved shape and becomes zero between the position A and the position C.

In all of the profiles P1A, P2A, and P3A, an average value of the second halogen atoms in the first region 11 is larger than an average value of the second halogen atoms in the second region 12.

In all of the profiles P1A, P2A, and P3A, an atomic number density of the second halogen atoms decreases gradually from a position at which the atomic number density of the second halogen atoms is maximum toward the second electrode 3 side in the layer thickness direction of the light-emitting layer 4.

In all of the profiles P1A, P2A, and P3A, a position at which the atomic number density of the second halogen atoms is maximum is the position A equivalent to the end 14 of the light-emitting layer 4 on the first electrode 2 side.

Although the profiles P1A, P2A, and P3A show an example in which the atomic number density of the second halogen atoms decreases monotonically in an upwardly convex curved shape, the disclosure is not limited thereto. As long as the atomic number density decreases gradually (monotonically) from the position A toward the position B, it may decrease linearly or may decrease in a curved shape.

Figure 5:
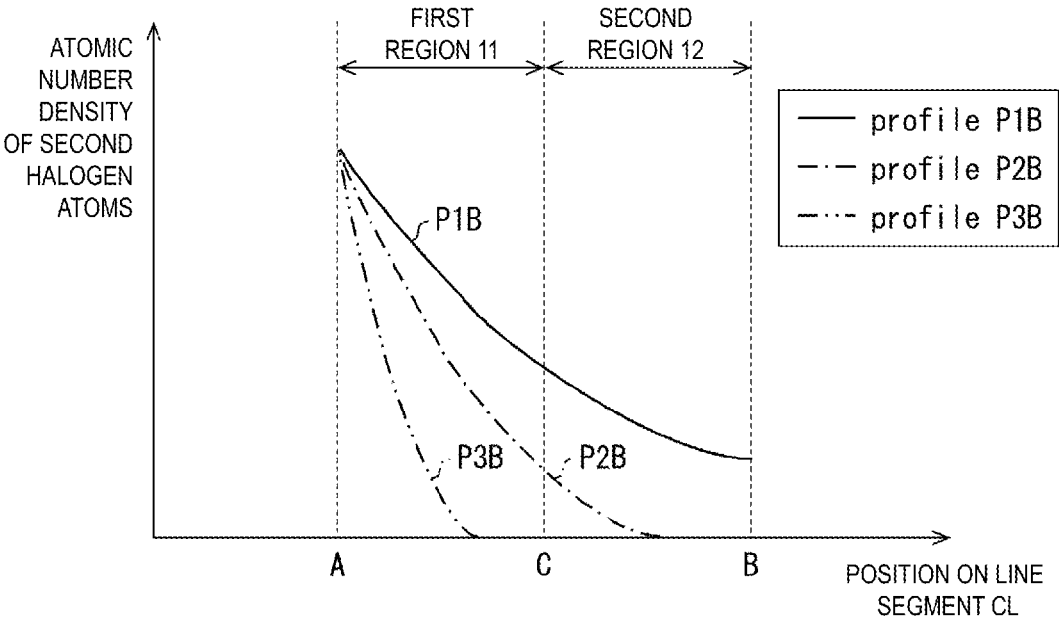
FIG. 5 is a schematic graph showing still another profile of the atomic number density of the second halogen atoms.

FIG. 5 is a schematic graph showing still another schematic profile of the atomic number density of the second halogen atoms. The same components as the above-described components are denoted by the same reference numerals, and detailed description of the components is not repeated.

In a profile P1B, an atomic number density of the second halogen atoms decreases gradually in a downwardly convex curved shape from the position A to the position B via the position C. In a profile P2B, an atomic number density of the second halogen atoms decreases gradually from the position A in a downwardly convex curved shape and becomes zero between the position C and the position B. In a profile P3B, an atomic number density of the second halogen atoms decreases gradually from the position A in a downwardly convex curved shape and becomes zero between the position A and the position C.

In all of the profiles P1B, P2B, and P3B, an average value of the second halogen atoms in the first region 11 is larger than an average value of the second halogen atoms in the second region 12.

In all of the profiles P1B, P2B, and P3B, the atomic number density of the second halogen atoms decreases gradually from a position at which the atomic number density of the second halogen atoms is maximum toward the second electrode 3 side in the layer thickness direction of the light-emitting layer 4.

In all of the profiles P1B, P2B, and P3B, a position at which the atomic number density of the second halogen atoms is maximum is the position A equivalent to the end 14 of the light-emitting layer 4 on the first electrode 2 side.

Although the profiles P1B, P2B, and P3B show an example in which the atomic number density of the second halogen atoms decreases monotonically in a downwardly convex curved shape, the disclosure is not limited thereto. As long as the atomic number density decreases gradually (monotonically) from the position A toward the position B, it may decrease linearly or may decrease in a curved shape.

Figure 6:
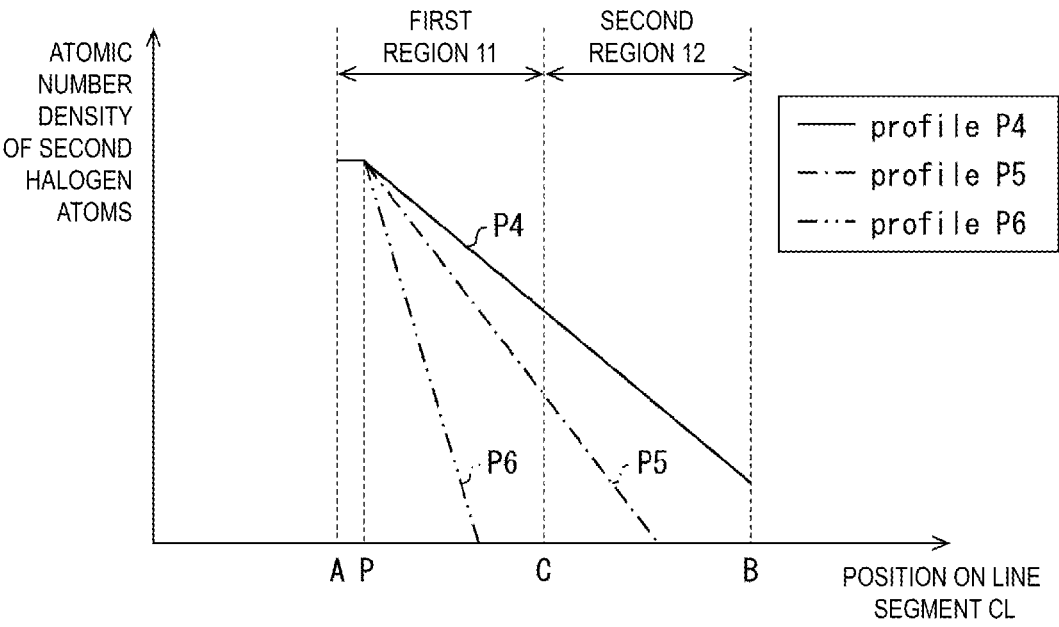
FIG. 6 is a schematic graph showing still another profile of the atomic number density of the second halogen atoms.

FIG. 6 is a schematic graph showing still another schematic profile of the atomic number density of the second halogen atoms. The same components as the above-described components are denoted by the same reference numerals, and detailed description of the components is not repeated.

A position P is a position at which the atomic number density of the second halogen atoms is maximum. The position P is disposed between the position A and the position C. In profiles P4, P5, and P6, the atomic number density of the second halogen atoms is constant and maximum in a region from the position A to the position P. However, the disclosure is not limited thereto. The atomic number density of the second halogen atoms may be maximum at the position P.

In all of the profiles P4, P5, and P6, an average value of the second halogen atoms in the first region 11 is larger than an average value of the second halogen atoms in the second region 12.

In all of the profiles P4, P5, and P6, the atomic number density of the second halogen atoms decreases gradually from the position P at which the atomic number density of the second halogen atoms is maximum toward the second electrode 3 side in the layer thickness direction of the light-emitting layer 4.

It is preferable that a distance between the position A and the position P on the line segment CL be smaller than the maximum size of one quantum dot in the light-emitting layer 4.

Although the profiles P4, P5, and P6 of the atomic number density in a region from the position P at which the atomic number density of the second halogen atoms decreases to the position B show an example in which the atomic number density decreases linearly, the disclosure is not limited thereto. As long as the atomic number density decreases monotonically or decreases gradually from the position P toward the position B, it may decrease in a curved shape.

Figure 7:
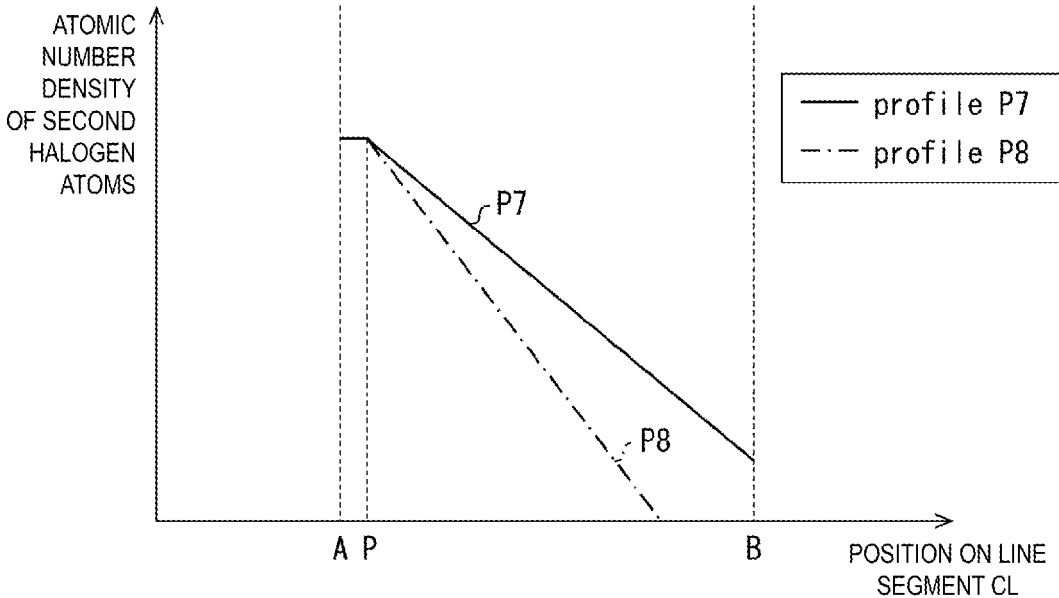
FIG. 7 is a schematic graph showing still another profile of the atomic number density of the second halogen atoms.

FIG. 7 is a schematic graph showing still another schematic profile of the atomic number density of the second halogen atoms. The same components as the above-described components are denoted by the same reference numerals, and detailed description of the components is not repeated.

A position P is a position at which the atomic number density of the second halogen atoms is maximum. The position P is disposed between the position A and the position B, and a positional relationship with the position C is arbitrary. That is, the position P may be present in the first region 11 or may be present in the second region 12.

In profiles P7 and P8, the atomic number density of the second halogen atoms is constant and maximum in a region from the position A to the position P. However, the disclosure is not limited thereto. The atomic number density of the second halogen atoms may be maximum at the position P.

In all of the profiles P7 and P8, the atomic number density of the second halogen atoms decreases gradually from the position P at which the atomic number density of the second halogen atoms is maximum toward the second electrode 3 side in the layer thickness direction of the light-emitting layer 4.

It is preferable that a distance between the position A and the position P on the line segment CL be smaller than the maximum size of one quantum dot in the light-emitting layer 4.

Although the profiles P7 and P8 of the atomic number density in a region from the position P at which the atomic number density of the second halogen atoms decreases to the position B show an example in which the atomic number density decreases linearly, the disclosure is not limited thereto. As long as the atomic number density decreases monotonically or decreases gradually from the position P toward the position B, it may decrease in a curved shape.

It is preferable that the atomic number density of the second halogen atoms in the light-emitting layer 4 decreases gradually from the position P at which the atomic number density of the second halogen atoms is maximum toward the second electrode 3 side in the layer thickness direction of the light-emitting layer 4. When the first halogen atoms of the interposition film 5 enter the light-emitting layer 4 and diffuse as the second halogen atoms, the atomic number density of the second halogen atoms decreases gradually toward the second electrode 3 side.

It is preferable that the position P at which the atomic number density of the second halogen atoms in the light-emitting layer 4 is maximum be located in a region from the end 14 of the light-emitting layer 4 on the first electrode 2 side to a depth equivalent to the maximum size of one quantum dot. Since the first halogen atoms of the interposition film 5 enter the light-emitting layer 4 and diffuse as the second halogen atoms, the position P at which the atomic number density of the second halogen atoms is maximum is located in a region from the end 14 of the light-emitting layer 4 on the first electrode 2 side to a depth equivalent to the maximum size of one quantum dot.

The size of one quantum dot means the diameter of a circle having the same area as a quantum dot in a transmission microscope image. As an example, when the quantum dot has a spherical shape, the size of the quantum dot means the diameter of the quantum dot. The maximum size of one quantum dot means the size of one quantum dot having the maximum size in a transmission microscope image of a cross-section exposed by cutting the light-emitting element along the layer thickness direction of the light-emitting layer.

It is preferable that a position at which the atomic number density of the second halogen atoms in the light-emitting layer 4 is maximum be the end 14 of the light-emitting layer 4 on the first electrode 2 side. Since the first halogen atoms of the interposition film 5 enter the light-emitting layer 4 and diffuse as the second halogen atoms, a position at which the atomic number density of the second halogen atoms is maximum is the end 14 of the light-emitting layer 4 on the first electrode 2 side.

It is preferable that an average value of the atomic number density of the second halogen atoms in the first region 11 be not 2 at % or more and 10 at % or less. When the average value of the atomic number density of the second halogen atoms is 2 at % or more, the second halogen atoms are coordinated with the surfaces of the quantum dots to inactivate the surfaces of the quantum dots, and thus it is possible to suppress non-radiative combination of electron-hole pairs. When the average value of the atomic number density of the second halogen atoms is 10 at % or less, it is possible to suppress a decrease in carrier mobility in the light-emitting layer 4 due to excessive second halogen atoms.

When the atomic number density of the second halogen atoms is excessively low, there is a concern that the surfaces of the quantum dots may be insufficiently inactivated, and when the atomic number density of the second halogen atoms is excessively high, there is a concern that the transport of carriers may be inhibited.

In the layer thickness direction of the light-emitting layer 4, it is preferable that a maximum value of the atomic number density of the second halogen atoms in the light-emitting layer 4 be 2 at % or more and 50 at % or less. As a result of the first halogen atoms entering and diffusing into the light-emitting layer 4, when the maximum value of the atomic number density of the second halogen atoms is 2 at % or more and 50 at % or less, the second halogen atoms are coordinated with the surfaces of the quantum dots to effectively inactivate the surfaces of the quantum dots, and it is possible to suppress non-radiative combination of electron-hole pairs. When the maximum value of the atomic number density of the second halogen atoms is 50 at % or less, it is possible to suppress a decrease in carrier mobility in the light-emitting layer 4 due to excessive second halogen atoms.

In the layer thickness direction of the light-emitting layer 4, the maximum value of the atomic number density of the second halogen atoms in the light-emitting layer 4 is more preferably 3 at % or more and 30 at % or less, and further preferably 4 at % or more and 20 at % or less. In this case, it is possible to further suppress a decrease in carrier mobility in the light-emitting layer 4 and more effectively suppress non-radiative recombination of electron-hole pairs in the light-emitting layer 4.

It is preferable that the light-emitting layer 4 and the interposition film 5 be in contact with each other at least partially. When the light-emitting layer 4 and the interposition film 5 are in contact with each other at least partially, the first halogen atoms of the interposition film 5 are likely to enter and diffuse into the light-emitting layer 4.

Since the second halogen atoms of the same element as the first halogen atoms contained in the interposition film 5 are coordinated with a portion of the surface of the quantum dot, holes can be efficiently injected.

The first halogen atoms and the second halogen atoms are preferably iodine atoms. The iodine atoms diffused from the interposition film 5 into the light-emitting layer 4 are coordinated with the surfaces of the quantum dots to inactivate the surfaces of the quantum dots, thereby suppressing non-radiative combination of electron-hole pairs.

A light-emitting device 9 includes a substrate 8 and the light-emitting element 1. The second electrode 3 of the light-emitting element 1 is disposed between the substrate 8 and the light-emitting layer 4. Thereby, the first halogen atoms of the interposition film 5 move toward the substrate 8 and the second halogen atoms diffused into the light-emitting layer 4 are coordinated with the surfaces of the quantum dots to inactivate the surfaces of the quantum dots, thereby suppressing non-radiative combination of electron-hole pairs. In the manufacturing process of the light-emitting device 9, the surface of the light-emitting layer 4 is exposed to the atmosphere after the formation of the light-emitting layer 4, and thus a ligand coordinated with the quantum dots is likely to be dissociated on the exposed surface of the light-emitting layer 4 or in the first region 11 of the light-emitting layer 4, and non-radiative recombination of electron-hole pairs is likely to occur. Thus, when the average value of the atomic number density of the second halogen atoms in the first region 11 is larger than the average value of the atomic number density of the second halogen atoms in the second region 12, when the position at which the atomic number density of the second halogen atoms in the light-emitting layer 4 is maximum is the end 14 of the light-emitting layer 4 on the first electrode 2 side, or when the position P at which the atomic number density of the second halogen atoms in the light-emitting layer 4 is maximum is located in a region from the end 14 of the light-emitting layer 4 on the first electrode 2 side to a depth equivalent to the maximum size of one quantum dot, it is possible to effectively suppress non-radiative recombination of electron-hole pairs and improve luminous efficiency.

The light-emitting element 1 is manufactured by a light-emitting element manufacturing method including a light-emitting layer forming step of forming the light-emitting layer 4 containing quantum dots, an interposition film forming step of forming the interposition film 5 on the light-emitting layer 4 formed by the light-emitting layer forming step, and a heat treatment step of performing heat treatment at 100° C. or more and 400° C. or less after the interposition film forming step. By performing the heat treatment at 100° C. or more and 400° C. or less after the interposition film forming step, the second halogen atoms derived from the first halogen atoms in the interposition film 5 and diffused into the light-emitting layer 4 are coordinated with the surfaces of the quantum dots. For this reason, the surfaces of the quantum dots are inactivated, and non-radiative combination of electron-hole pairs is suppressed. As a result, luminous efficiency of the light-emitting element 1 is improved.

The heat treatment step may be performed at any time after the light-emitting layer forming step and the interposition film forming step. For example, the heat treatment step may be performed after a step of forming the first electrode 2.

The interposition film 5 is preferably formed by a vapor deposition method. By performing heat treatment on the interposition film 5 formed by the vapor deposition method, the second halogen atoms derived from the first halogen atoms in the interposition film 5 and diffused into the light-emitting layer 4 are coordinated with the surfaces of the quantum dots.

When the interposition film 5 is formed by a vapor deposition method, the first halogen atoms are likely to be taken into the light-emitting layer 4 containing quantum dots.

By performing the heat treatment at approximately 100° C. to 400° C., preferably 120° C. to 250° C., excessive iodine in the interposition film 5 diffuses into the light-emitting layer 4 containing quantum dots. The heat treatment is preferably performed in an inert gas atmosphere (for example, in an $N_2$ atmosphere, an Ar atmosphere, or the like). A portion of the excessive iodine diffused into the light-emitting layer 4 is coordinated with the surfaces of the quantum dots contained in the light-emitting layer 4 to inactivate the surfaces of the quantum dots, thereby suppressing non-radiative recombination of electron-hole pairs.

Another layer that does not completely inhibit diffusion of halogen atoms may be formed between the interposition film 5 and the light-emitting layer 4. Other layers may be further formed between layers other than between the interposition film 5 and the light-emitting layer 4. The interposition film 5 functions as a hole transport layer or a hole injection layer.

Figure 8:
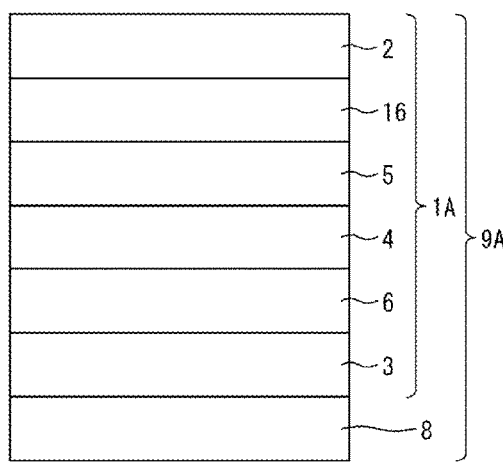
FIG. 8 is a cross-sectional view of a modified example of the light-emitting element.

FIG. 8 is a cross-sectional view of a modified example of the light-emitting element 1. The same components as the above-described components are denoted by the same reference numerals, and description of the components is not repeated.

A light-emitting device 9A includes a light-emitting element 1A and a substrate 8. An interposition film 5 contains, for example, a halogen simple substance which is solid iodine. The light-emitting element 1A includes a hole transport layer 16 formed between a first electrode 2 and the interposition film 5. The hole transport layer 16 can be formed using a known material such as PEDOT:PSS, TFB, PVK, TPD, Tcta, CuI, NiO, $Cu_2O$, and a combination thereof (for example, a layered body, a mixture, or the like).

Figure 9:
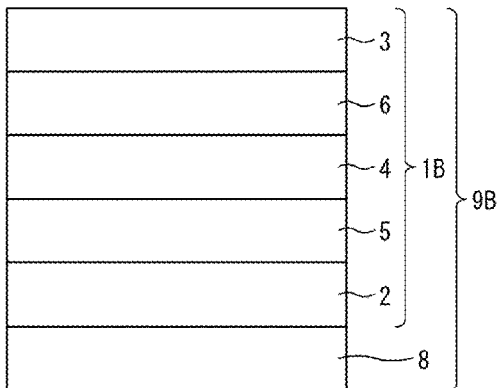
FIG. 9 is a cross-sectional view of another modified example of the light-emitting element.

FIG. 9 is a cross-sectional view of a light-emitting element 1B according to another modified example of the light-emitting element 1. The same components as the above-described components are denoted by the same reference numerals, and description of the components is not repeated.

As illustrated in FIG. 9, the light-emitting element 1B may be layered on a substrate 8 in a layering order reverse to that of the light-emitting element 1 described above. The light-emitting element 1B and the substrate 8 constitute a light-emitting device 9B.

Figure 10:
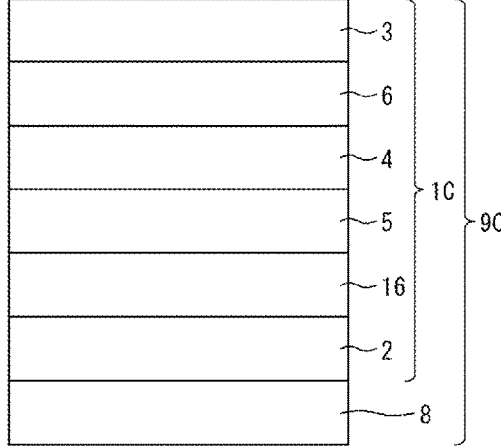
FIG. 10 is a cross-sectional view of still another modified example of the light-emitting element.

FIG. 10 is a cross-sectional view of still another modified example of the light-emitting element 1. The same components as the above-described components are denoted by the same reference numerals, and description of the components is not repeated.

As illustrated in FIG. 10, a light-emitting element 1C may be layered on a substrate 8 in a layering order reverse to that of the light-emitting element 1A described above. The light-emitting element 1C and the substrate 8 constitute a light-emitting device 9C.

An interposition film 5 contains, for example, a halogen simple substance which is solid iodine. The light-emitting element 1C includes a hole transport layer 16 formed between a first electrode 2 and the interposition film 5.

Second Embodiment

Figure 11:
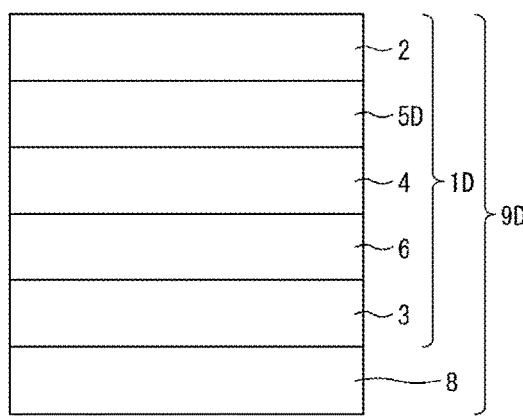
FIG. 11 is a cross-sectional view of a light-emitting element according to a second embodiment.

FIG. 11 is a cross-sectional view of a light-emitting element 1D according to a second embodiment. The same components as the above-described components are denoted by the same reference numerals, and detailed description of the components is not repeated.

The light-emitting element 1D includes a first electrode 2, a second electrode 3, a light-emitting layer 4 provided between the first electrode 2 and the second electrode 3 and containing quantum dots, an interposition film 5D interposed between the first electrode 2 and the light-emitting layer 4, and an electron transport layer 6 formed between the second electrode 3 and the light-emitting layer 4.

The interposition film 5D contains first metal atoms and first halogen atoms. The interposition film 5D contains, for example, a compound of the first metal atoms and the first halogen atoms.

The light-emitting layer 4 further contains second halogen atoms of the same element as the first halogen atoms.

Thereby, the second halogen atoms contained in the light-emitting layer 4 are coordinated with the surfaces of the quantum dots to inactivate the surfaces of the quantum dots, thereby suppressing non-radiative combination of electron-hole pairs. As a result, luminous efficiency of the light-emitting element 1B is improved.

The first metal atoms contained in the interposition film 5D are preferably copper. The interposition film 5D containing copper and the first halogen atoms allows holes injected from the first electrode 2 into the interposition film 5D to be transported to the light-emitting layer 4 containing quantum dots.

The interposition film 5D preferably contains copper iodide. Thereby, excessive iodine of the copper iodide in the interposition film 5D diffuses into the light-emitting layer 4 containing quantum dots and is coordinated with the surfaces of the quantum dots to inactivate the surfaces of the quantum dots, thereby suppressing non-radiative combination of electron-hole pairs.

The quantum dots contained in the light-emitting layer 4 preferably include second metal atoms. The second metal atoms are preferably at least one of Cd, In, Zn, Pb, Cs, Rb, and Sn. The second halogen atoms derived from the first halogen atoms of the interposition film 5D and diffused into the light-emitting layer 4 are coordinated with any one or more of Cd, In, Zn, Pb, Cs, Rb, and Sn of the quantum dots to inactivate any one or more of Cd, In, Zn, Pb, Cs, Rb, and Sn, thereby suppressing non-radiative combination of electron-hole pairs.

The first halogen atoms in the interposition film 5D are, for example, chloride atoms, bromide atoms, or iodine atoms. The compound of the first metal atoms and the first halogen atoms in the interposition film 5D is, for example, copper chloride, copper bromide, or copper iodide.

Figure 12:
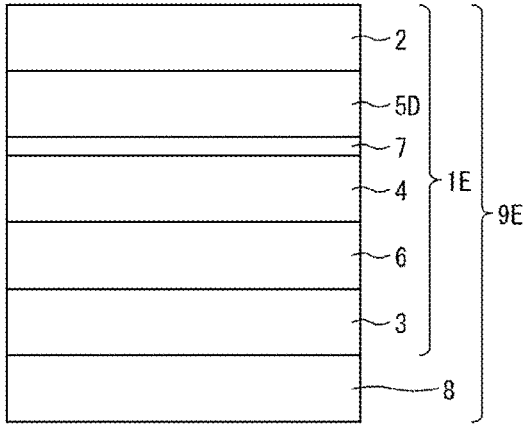
FIG. 12 is a cross-sectional view of a modified example of the light-emitting element.

FIG. 12 is a cross-sectional view of a modified example of the light-emitting element 1D. The same components as the above-described components are denoted by the same reference numerals, and detailed description of the components is not repeated.

A light-emitting element 1E according to this modified example further includes a second interposition film 7 provided between the interposition film 5D and the light-emitting layer 4. The second interposition film 7 contains iodine atoms. Thereby, the iodine atoms diffused from the interposition film 5D and the second interposition film 7 into the light-emitting layer 4 are coordinated with the surfaces of the quantum dots to inactivate the surfaces of the quantum dots, thereby suppressing non-radiative combination of electron-hole pairs. The second interposition film 7 is made of, for example, solid iodine. The second interposition film 7 may contain impurities and the like other than iodine atoms.

An atomic number density of the iodine atoms contained in the second interposition film 7 is preferably 75 at % or more. Thereby, the iodine atoms of the second interposition film 7 are likely to enter and diffuse into the light-emitting layer 4.

A light-emitting device 9E includes a substrate 8 and a light-emitting element 1E. The second electrode 3 of the light-emitting element 1E is disposed between the substrate 8 and the light-emitting layer 4. In the manufacturing process of the light-emitting device 9E, the surface of the light-emitting layer 4 is exposed to the atmosphere after the formation of the light-emitting layer 4, and thus a ligand coordinated with the quantum dots is likely to be dissociated on the exposed surface of the light-emitting layer 4 or near the exposed surface of the light-emitting layer 4, and non-radiative recombination of electron-hole pairs is likely to occur. Thus, in the light-emitting device 9E, the first halogen atoms of the interposition film 5D move toward the substrate 8 and the second halogen atoms diffused into the light-emitting layer 4 are coordinated with the surfaces of the quantum dots to inactivate the surfaces of the quantum dots, thereby suppressing non-radiative combination of electron-hole pairs. Iodine contained in the second interposition film 7 diffuses into the light-emitting layer 4 to further effectively inactivate the surfaces of the quantum dots, and thus it is possible to suppress non-radiative recombination of electron-hole pairs.

The light-emitting element 1E is manufactured by a light-emitting element manufacturing method including a light-emitting layer forming step of forming the light-emitting layer 4 containing quantum dots, an interposition film forming step of forming the interposition film 5D on the light-emitting layer 4 formed by the light-emitting layer forming step, and a heat treatment step of performing heat treatment at 100° C. or more and 400° C. or less after the interposition film forming step. By performing the heat treatment at 100° C. or more and 400° C. or less after the interposition film forming step, the second halogen atoms derived from the first halogen atoms in the interposition film 5D and diffused into the light-emitting layer 4 are coordinated with the surfaces of the quantum dots. For this reason, the surfaces of the quantum dots are inactivated, and non-radiative combination of electron-hole pairs is suppressed. As a result, luminous efficiency of the light-emitting element 1B is improved.

The interposition film 5D is preferably formed by a vapor deposition method. By performing heat treatment on the interposition film 5D formed by the vapor deposition method, the second halogen atoms derived from the first halogen atoms in the interposition film 5D and diffused into the light-emitting layer 4 are coordinated with the surfaces of the quantum dots.

It is preferable that the interposition film forming step further include a second interposition film forming step of forming the interposition film 5D on the light-emitting layer 4 and forming the second interposition film 7 on the light-emitting layer 4 between the light-emitting layer forming step and the interposition film forming step. Since the interposition film 5D is formed on the second interposition film 7, the iodine atoms diffused from the interposition film 5D and the second interposition film 7 into the light-emitting layer 4 are coordinated with the surfaces of the quantum dots to inactivate the surfaces of the quantum dots, thereby suppressing non-radiative combination of electron-hole pairs.

In the second interposition film forming step, the second interposition film 7 is preferably formed by a vapor deposition method. By performing heat treatment on the second interposition film 7 formed by the vapor deposition method, the second halogen atoms derived from the first halogen atoms in the second interposition film 7 and diffused into the light-emitting layer 4 are coordinated with the surfaces of the quantum dots.

Figure 13:
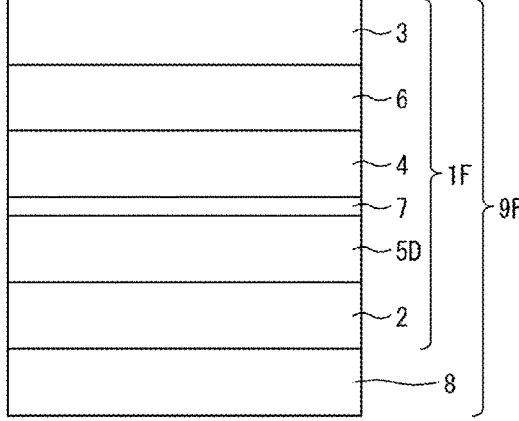
FIG. 13 is a cross-sectional view of another modified example of the light-emitting element.

FIG. 13 is a cross-sectional view of a light-emitting element 1F which is another modified example of the light-emitting element 1D. The same components as the above-described components are denoted by the same reference numerals, and detailed description of the components is not repeated.

As illustrated in FIG. 13, the light-emitting element 1F may be layered on the substrate 8 in a layering order reverse to that of the light-emitting element 1E described above. The light-emitting element 1F and the substrate 8 constitute a light-emitting device 9F.

Figure 14:
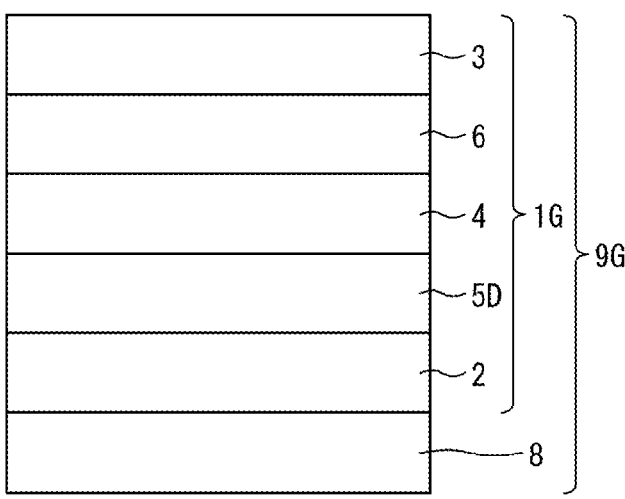
FIG. 14 is a cross-sectional view of still another modified example of the light-emitting element.

FIG. 14 is a cross-sectional view of a light-emitting element 1G which is still another modified example of the light-emitting element 1D. The same components as the above-described components are denoted by the same reference numerals, and detailed description of the components is not repeated.

As illustrated in FIG. 14, the light-emitting element 1G may be layered on the substrate 8 in a layering order reverse to that of the light-emitting element 1D described above. The light-emitting element 1G and the substrate 8 constitute a light-emitting device 9G.

The light-emitting elements 11A, 1B, 1C, 1D, 1E, 1F, and 1G described above are provided in electronic devices. The electronic devices provided with the light-emitting elements 1 to 1G may be any electronic devices including the light-emitting elements 1 to 1G according to the present embodiment, such as a television receiver, a PC monitor, a display, and a display device such as an information display.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A light-emitting element comprising:
a first electrode;
a second electrode;
a light-emitting layer provided between the first electrode and the second electrode, and including quantum dots; and
an interposition film interposed between the first electrode and the light-emitting layer,
wherein the interposition film includes first metal atoms, and a halogen simple substance including first halogen atoms, and
the light-emitting layer further includes second halogen atoms of a same element as the first halogen atoms.

2. The light-emitting element according to claim 1, wherein the second halogen atoms are derived from the first halogen atoms.

3. The light-emitting element according to claim 1, wherein a maximum value of an atomic number density of the second halogen atoms in the light-emitting layer is 2 at % or more and 50 at % or less in a layer thickness direction of the light-emitting layer.

4. The light-emitting element according to claim 1,
wherein the light-emitting layer and the interposition film are at least partially in contact with each other.

5. The light-emitting element according to claim 1, wherein the first halogen atoms and the second halogen atoms are iodine atoms.

6. The light-emitting element according to claim 1, wherein the quantum dots include second metal atoms, and the second metal atoms are any one or more of Cd, In, Zn, Pb, Cs, Rb, and Sn.

7. A light-emitting device comprising:
the light-emitting element according to claim 1; and
a substrate,
wherein the second electrode is disposed between the substrate and the light-emitting layer.

8. An electronic device comprising the light-emitting element according to claim 1.

9. The light-emitting element according to claim 1, wherein the first metal atoms are copper.

10. The light-emitting element according to claim 1, wherein the interposition film includes copper iodide.

11. The light-emitting element according to claim 1,
wherein the light-emitting layer includes a first region, from a center of the light-emitting layer to an end on a first electrode side in a layer thickness direction, and a second region, from the center of the light-emitting layer to an end on a second electrode side in the layer thickness direction, and
an average value of an atomic number density of the second halogen atoms in the first region is larger than an average value of an atomic number density of the second halogen atoms in the second region.

12. The light-emitting element according to claim 11, wherein the atomic number density of the second halogen atoms in the first region is 2 at % or more and 10 at % or less.

13. The light-emitting element according to claim 1,
wherein an atomic number density of the second halogen atoms in the light-emitting layer decreases gradually, from a position at which the atomic number density of the second halogen atoms is maximum, toward a second electrode side in a layer thickness direction of the light-emitting layer.

14. The light-emitting element according to claim 13, wherein the position at which the atomic number density of the second halogen atoms in the light-emitting layer is maximum is located in a region from an end of the light-emitting layer on a first electrode side to a depth equivalent to a maximum size of one quantum dot.

15. The light-emitting element according to claim 13, wherein the position at which the atomic number density of the second halogen atoms in the light-emitting layer is maximum is an end of the light-emitting layer on a first electrode side.

16. The light-emitting element according to claim 1, further comprising:
a second interposition film interposed between the first electrode and the interposition film,
wherein the second interposition film includes first metal atoms and third halogen atoms of the same element as the first halogen atoms.

17. The light-emitting element according to claim 16, wherein the second interposition film includes iodine atoms, and an atomic number density of the iodine atoms is 75 at % or more.

18. A light-emitting device comprising:

the light-emitting element according to claim 16; and a substrate, wherein the second electrode is disposed between the
   substrate and the light-emitting layer.

\* \* \* \* \*